US009018638B2

(12) United States Patent
Liu et al.

(10) Patent No.: US 9,018,638 B2
(45) Date of Patent: Apr. 28, 2015

(54) MOSFET DEVICE

(71) Applicant: Industrial Technology Research Institute, Hsinchu (TW)

(72) Inventors: Chee-Wee Liu, Taipei (TW); Hui-Hsuan Wang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 18 days.

(21) Appl. No.: 13/914,640

(22) Filed: Jun. 11, 2013

(65) Prior Publication Data

US 2014/0124774 A1 May 8, 2014

(30) Foreign Application Priority Data

Nov. 6, 2012 (TW) .............................. 101141197 A

(51) Int. Cl.
*H01L 29/15* (2006.01)
*H01L 29/78* (2006.01)
(Continued)

(52) U.S. Cl.
CPC ........ *H01L 29/7835* (2013.01); *H01L 29/7827* (2013.01); *H01L 29/66068* (2013.01); *H01L 29/66409* (2013.01); *H01L 29/1608* (2013.01); *H01L 29/66666* (2013.01); *H01L 29/66477* (2013.01); *H01L 29/1095* (2013.01);
(Continued)

(58) Field of Classification Search
CPC ...................... H01L 29/1095; H01L 29/66409; H01L 29/66146; H01L 29/66477; H01L 29/66666; H01L 29/66712; H01L 29/0607; H01L 29/0611; H01L 29/0615; H01L 29/0619; H01L 29/0263; H01L 29/1608; H01L 29/66068; H01L 29/7827
See application file for complete search history.

(56) References Cited

U.S. PATENT DOCUMENTS 6,037,632 A * 3/2000 Omura et al. ................. 257/341
6,465,304 B1 * 10/2002 Blanchard et al. ............ 438/268
(Continued)

FOREIGN PATENT DOCUMENTS

TW 529151 4/2003
TW I272679 2/2007
(Continued)

OTHER PUBLICATIONS

Imam et al., "Efficacy of Charge Sharing in Reshaping the Surface Electric Filed in High-Voltage Lateral RESURF Devices," IEEE Transactions on Electron Devices 51 (1), Jan. 2004, pp. 141-148.
(Continued)

*Primary Examiner* — Fei Fei Yeung Lopez
(74) *Attorney, Agent, or Firm* — Jianq Chyun IP Office

(57) ABSTRACT

A MOSFET device is provided. An N-type epitaxial layer is disposed on an N-type substrate. An insulating trench is disposed in the epitaxial layer. A P-type well region is disposed in the epitaxial layer at one side of the insulating trench. An N-type heavily doped region is disposed in the well region. A gate structure is disposed on the epitaxial layer and partially overlaps with the heavily doped region. At least two P-type first doped regions are disposed in the epitaxial layer below the well region. At least one P-type second doped region is disposed in the epitaxial layer and located between the first doped regions. Besides, the first and second doped regions are separated from each other. The first doped regions extend along a first direction, and the second doped region extends along a second direction different from the first direction.

15 Claims, 14 Drawing Sheets

(51) Int. Cl.
 *H01L 29/66* (2006.01)
 *H01L 29/16* (2006.01)
 *H01L 29/10* (2006.01)
 *H01L 29/06* (2006.01)

(52) U.S. Cl.
 CPC ........ *H01L29/0619* (2013.01); *H01L 29/0607* (2013.01); *H01L 29/0615* (2013.01); *H01L 29/0623* (2013.01); *H01L 29/66416* (2013.01); *H01L 29/66712* (2013.01); *H01L 29/0611* (2013.01)

(56) References Cited

U.S. PATENT DOCUMENTS

| | | | |
|---|---|---|---|
| 6,803,626 | B2 | 10/2004 | Sapp et al. |
| 8,154,073 | B2 | 4/2012 | Aoki et al. |
| 2004/0014451 | A1* | 1/2004 | Sapp et al. ............ 455/335 |
| 2006/0011962 | A1* | 1/2006 | Kocon ............ 257/302 |
| 2008/0099837 | A1* | 5/2008 | Akiyama et al. ........ 257/341 |
| 2011/0254010 | A1* | 10/2011 | Zhang ............ 257/66 |
| 2012/0037920 | A1 | 2/2012 | Treu et al. |
| 2012/0132986 | A1 | 5/2012 | Kang et al. |

FOREIGN PATENT DOCUMENTS

| | | |
|---|---|---|
| TW | I353025 | 11/2011 |
| TW | I371107 | 8/2012 |
| TW | I374474 | 10/2012 |

OTHER PUBLICATIONS

Cezac et al., "A New Generation of Power Unipolar Devices: the Concept of the FLoating Islands MOS Transistor (FLIMOST)," IEEE Transactions on Electron Devices, May 22-25, 2000, pp. 69-72.

Hirler et al., "YFET—Trench Superjunction Process Window extended," 21st International Symposium on Power Semiconductor Devices & IC's, Jun. 14-18, 2009, pp. 299-302.

"Office Action of Taiwan Counterpart Application", issued on Dec. 23, 2014, p. 1-p. 4.

* cited by examiner

US 9,018,638 B2

MOSFET DEVICE

CROSS-REFERENCE TO RELATED APPLICATION

This application claims the priority benefit of Taiwan application serial no. 101141197, filed on Nov. 6, 2012. The entirety of the above-mentioned patent application is hereby incorporated by reference herein and made a part of this specification.

TECHNICAL FIELD

The disclosure relates to a metal oxide semiconductor field effect transistor (MOSFET) device.

BACKGROUND

Among the types of semiconductor devices, MOSFET devices have become one of the most important and widely used devices in the integrated circuits because of their low power consumption and suitability for high-density integration.

One common MOSFET device is a double-diffused MOSFET (DMOSFET). The two commonly seen double-diffused MOSFETs are lateral double-diffused MOSFET (LDMOSFET) and vertical double-diffused MOSFET (VDMOSFET).

However, for the conventional double-diffused MOSFET, the ability of increasing breakdown voltage is limited, regardless of whether a LDMOSFET device or a VDMOSFET device is applied.

SUMMARY

One of exemplary embodiments comprises a metal oxide semiconductor field effect transistor device. An epitaxial layer of a first conductivity type is disposed on a substrate of the first conductivity type. An insulating trench is disposed in the epitaxial layer. A well region of a second conductivity type is disposed in the epitaxial layer at one side of the insulating trench. A heavily doped region of the first conductivity type is disposed in the well region. A gate structure is disposed on the epitaxial layer and partially overlaps with the heavily doped region. At least two first doped regions of the second conductivity type are disposed in the epitaxial layer below the well region. At least one second doped region of the second conductivity type is disposed in the epitaxial layer and is located between the first doped regions. In addition, the first doped regions and the second doped region are separated from each other, wherein the first doped regions extend along a first direction and the second doped region extends along a second direction where the first direction is different from the second direction.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
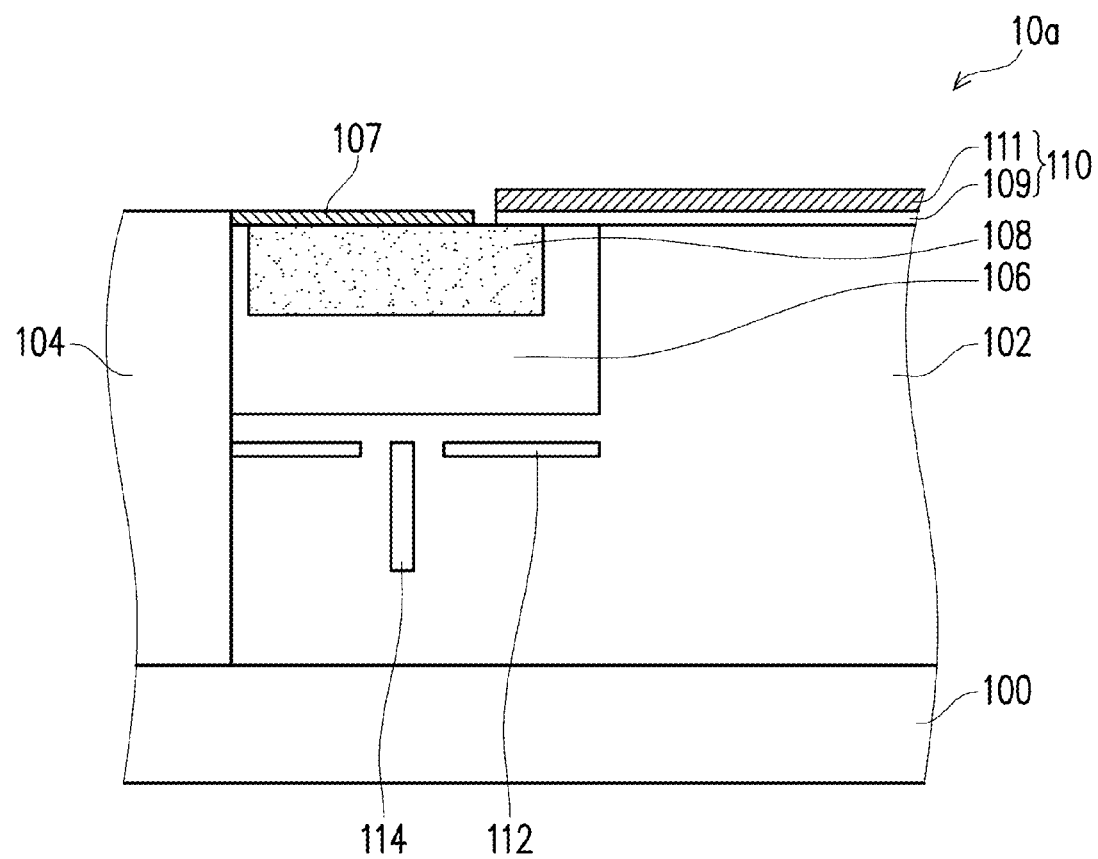
FIG. 1A schematically illustrates a cross sectional view of a MOSFET device according to an embodiment of the disclosure.

FIG. 1A schematically illustrates a cross sectional view of a MOSFET device according to an embodiment of the disclosure.

Referring to FIG. 1A, the MOSFET device 10a of the disclosure includes a substrate 100 of a first conductivity type, an epitaxial layer 102 of the first conductivity type, an insulating trench 104, a well region 106 of a second conductivity type, a heavily doped region 108 of the first conductivity type and a gate structure 110.

The substrate 100 can be an N-type heavily doped (N$^+$) substrate, such as a silicon substrate or a silicon carbide substrate. Such N$^+$ silicon carbide substrate can serve as a drain of the MOSFET device 10. The epitaxial layer 102 can be an N-type lightly doped (N$^-$) epitaxial layer disposed on the substrate 100. The epitaxial layer 102 includes silicon or silicon carbide. N$^+$ indicates an N-type dopant with higher concentration, and N$^-$ indicates an N-type dopant with lower concentration.

The insulating trench 104 is disposed in the epitaxial layer 102. The filled material in the insulating trench 104 includes silicon oxide, silicon nitride or silicon oxynitride, and the aforementioned materials can be used alone or in combination. In an embodiment, the insulating trench 104 penetrates through the epitaxial layer 102, and is in contact with the substrate 100, as shown in FIG. 1A. In another embodiment (not shown), the insulating trench 104 can also be disposed without contacting the substrate.

The well region 106 can be a P-type well region disposed in the epitaxial layer 102 at one side of the insulating trench 104. More specifically, the well region 106 is adjoined to the sidewall of the insulating trench 104, and is in contact with the insulating trench 104.

The heavily doped region 108 can be an N+ doped region, which can serve as a source of the MOSFET device 10a. The heavily doped region 108 is disposed in the well region 106. More specifically, the side surface and the bottom surface of the heavily doped region 108 are surrounded by the well region 106, so that the heavily doped region 108 is not in contact with the sidewall of the insulating trench 104. In an embodiment, a Schottky contact 107 can also be disposed on a surface of the heavily doped region 108, so as to reduce the resistance of the source. The Schottky contact 107 includes metal, such as nickel or aluminium.

The gate structure 110 is disposed on the epitaxial layer 102, and partially overlaps with the heavily doped region 108. The gate structure 110 includes a gate insulating layer 109 and a gate 111. The gate insulating layer 109 includes silicon oxide. The gate 111 includes doped polysilicon.

In addition, the MOSFET device 10a of the disclosure further includes at least two first doped regions 112 of the second conductivity type and at least one second doped region 114 of the second conductivity type.

The first doped regions 112 can be P-type doped regions disposed in the epitaxial layer 102 below the well region 106. The second doped region 114 can be a P-type doped region disposed in the epitaxial layer 102 and located between the first doped regions 112. In addition, a doping concentration of the second doped region 114 is less than that of each first doped region 112, but the doping concentration of the second doped region 114 is greater than that of the epitaxial layer 102.

Figure 1B:
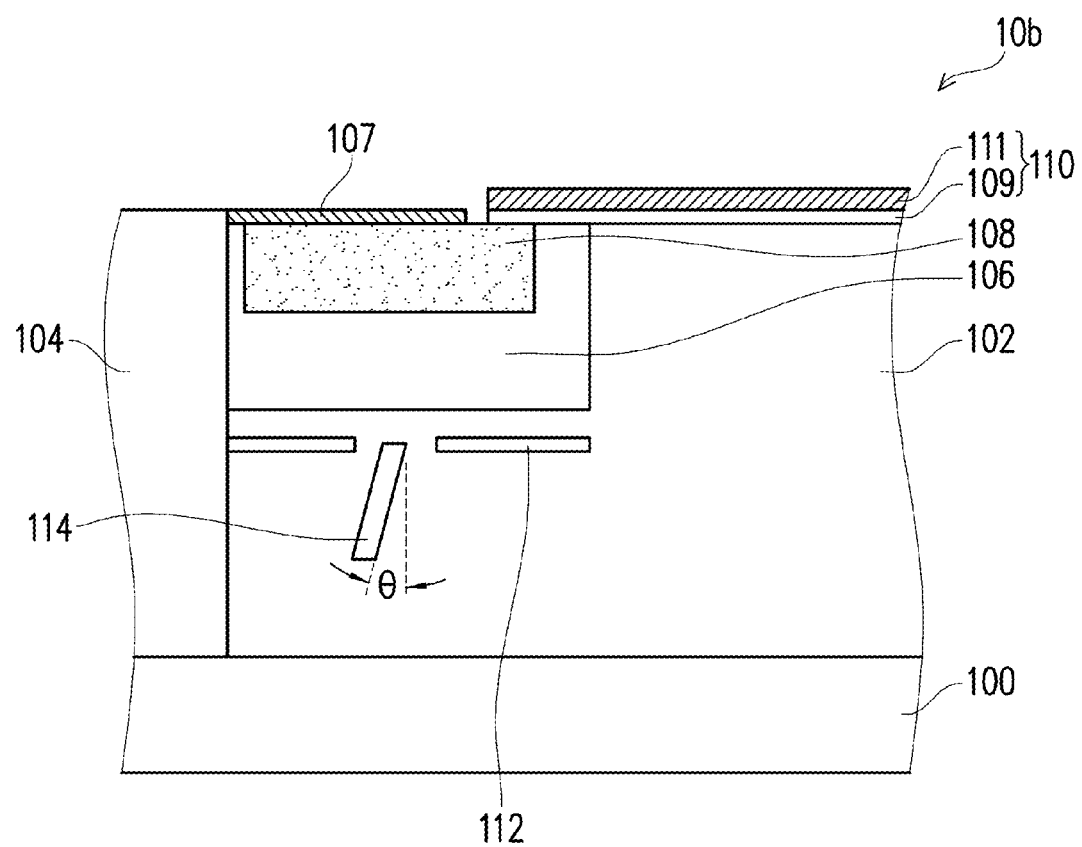
FIG. 1B schematically illustrates a cross sectional view of a MOSFET device according to another embodiment of the disclosure.

It is noted that, the first doped regions 112 and the second doped region 114 are separated from each other, wherein the first doped regions 112 extend along a first direction and the second doped region 114 extends along a second direction where the first direction is different from the second direction. In an embodiment, the second direction is perpendicular to the first direction. For example, the first direction is the X-direction and the second direction is the Y-direction, for instance. Namely, the first doped regions 112 are horizontal doped regions (or can be referred as horizontal islands), and the second doped region 114 is a vertical doped region (or can be referred as a vertical island), as shown in FIG. 1A. However, the disclosure is not limited thereto. In another embodiment, when the first direction is the X-direction, the second direction can be a direction having an included angle θ with the Y-direction, and the range of the included angle θ is greater than 0 degree and less than 90 degrees, as shown in FIG. 1B.

A top surface of the second doped region 114 is substantially not higher than that of each first doped region 112. In an embodiment, the top surface of the second doped region 114 is substantially coplanar with that of each first doped region 112, as shown in FIG. 1A. In addition, a bottom surface of the second doped region 114 is located at about 70%-80% of the depth of the epitaxial layer 102 (starting from the surface of the epitaxial layer 102).

In the aforementioned embodiment, two first doped regions 112 and one second doped region 114 are exemplified for illustration purpose, but the disclosure is not limited thereto. In other words, the number of the first doped region 112 and the number of the second doped region 114 are not limited by the disclosure.

Figure 1C:
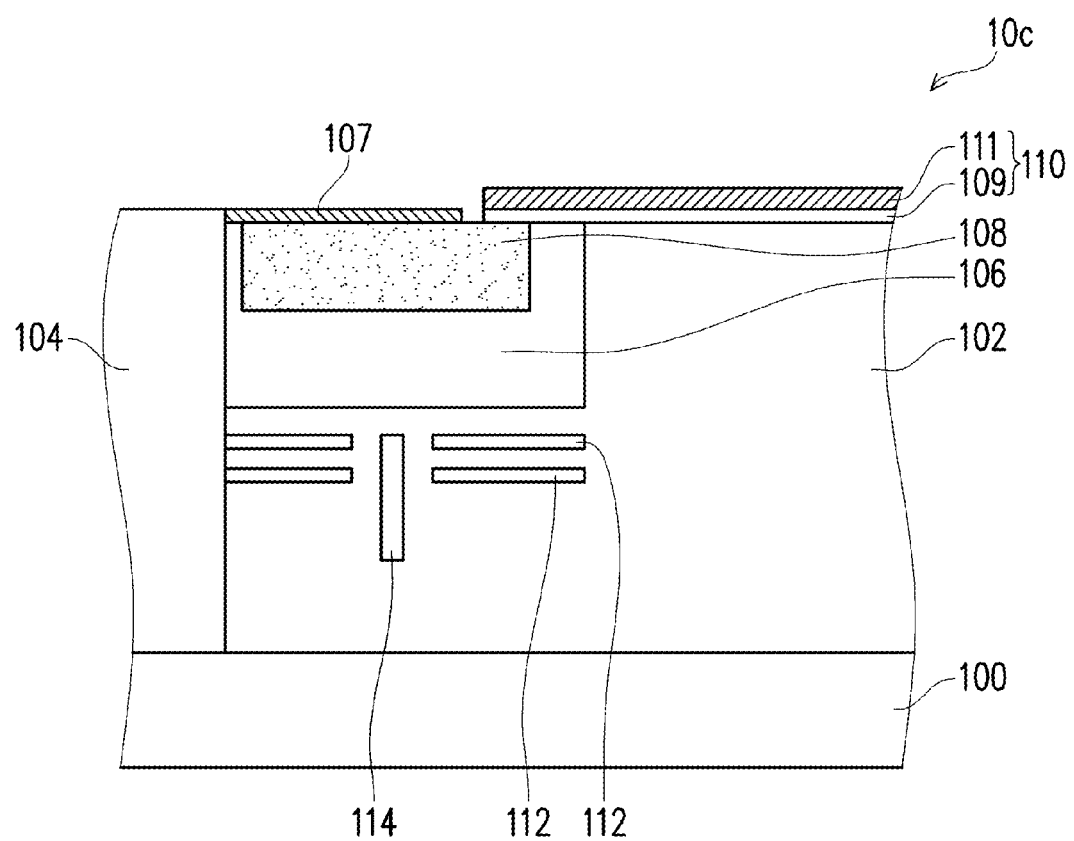
FIG. 1C schematically illustrates a cross sectional view of a MOSFET device according to yet another embodiment of the disclosure.
Figure 1D:
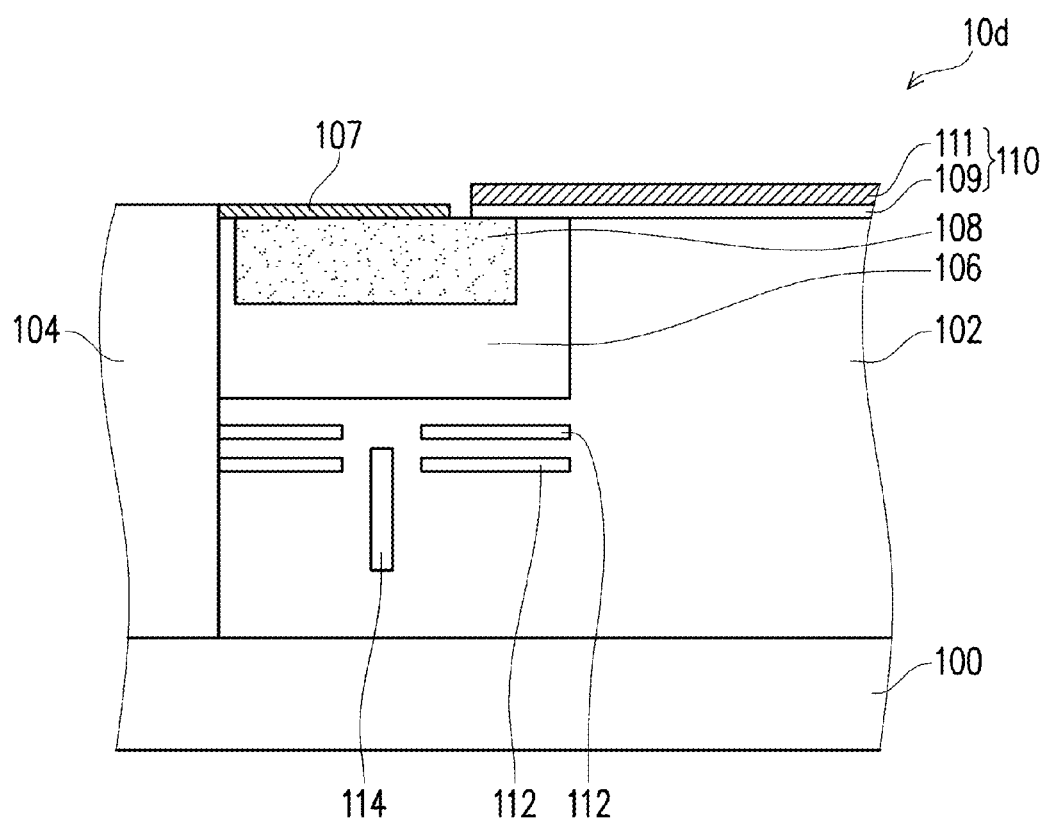
FIG. 1D schematically illustrates a cross sectional view of a MOSFET device according to still another embodiment of the disclosure.

In another embodiment, the MOSFET device of the disclosure can also have four first doped regions 112 and one second doped region 114. These first doped regions 112 are disposed at two sides of the second doped region 114. For example, two first doped regions 112 are disposed at each side of the second doped region 114, and the first doped regions 112 appear to be disposed symmetrically, as shown in FIG. 1C. In the embodiment, the top surface of the second doped region 114 is substantially not higher than the highest top surface of the first doped regions 112, and is not lower than the lowest bottom surface of the first doped regions 112. For example, the top surface of the second doped region 114 can be coplanar with the highest top surface of the first doped regions 112 (as shown in FIG. 1C), or can be between the first layer of the first doped regions 112 and the second layer of the first doped regions 112 (as shown in FIG. 1D).

Figure 1E:
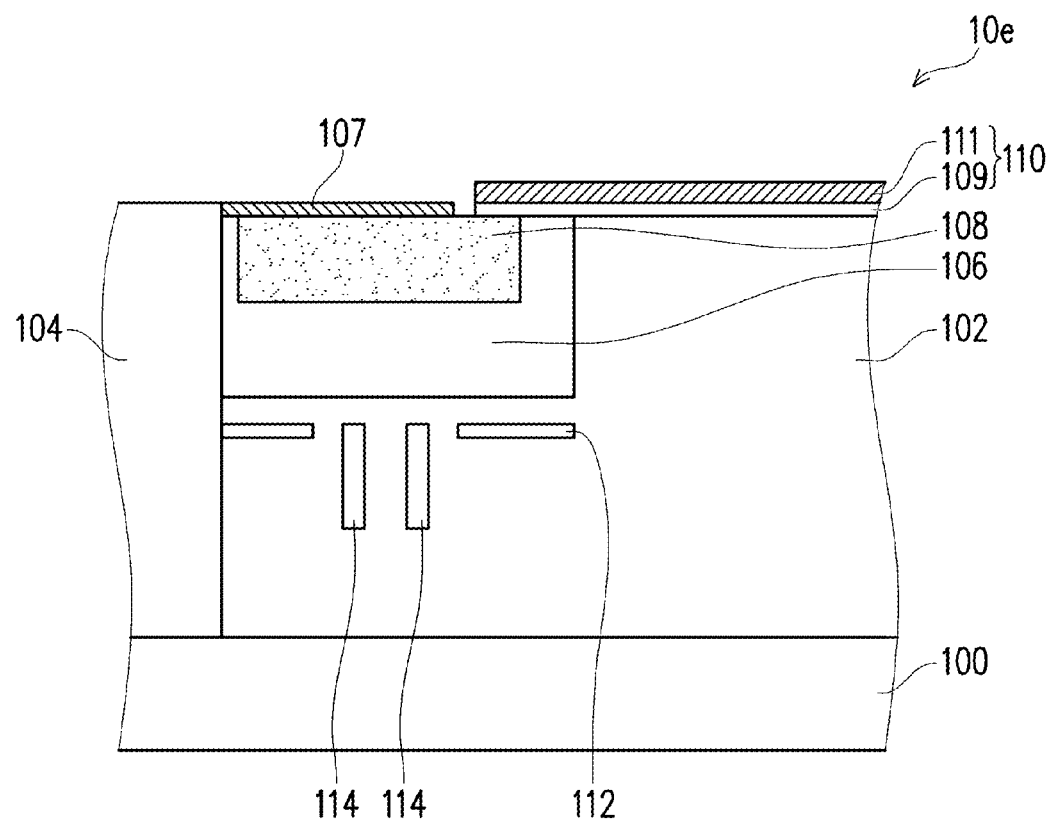
FIG. 1E schematically illustrates a cross sectional view of a MOSFET device according to an embodiment of the disclosure.

In yet another embodiment, the MOSFET device of the disclosure can also have two first doped regions 112 and two second doped regions 114, and the top surfaces of the aforementioned doped regions are generally coplanar, as shown in FIG. 1E.

It is noted that, at least one P-type vertical doped region is disposed between at least two P-type horizontal doped regions in the MOSFET device of the disclosure, so that the electric field between each P-type horizontal doped regions and the N-type epitaxial layer can be reduced by the charge sharing effect. In addition, the aforementioned configuration can also reduce the electric field between the P-type well region and the N-type epitaxial layer, thereby enhancing the breakdown voltage of the device.

Additionally, under the condition of having same layers of horizontal islands, as compared with the case of a super junction device being required to satisfy the charge balance (i.e., the acceptor number equals to the donor number: $Q_a=Q_d$), the breakdown voltage of the MOSFET device of the disclosure can be enhanced easily as long as the doping concentration of the vertical doped region is greater than that of the epitaxial layer (i.e., the acceptor doping concentration is greater than the donor doping concentration: $N_a>N_d$). In other words, the MOSFET device of the disclosure has greater process window than the conventional super junction device, in terms of enhancing the breakdown voltage.

The first conductivity type is N-type and the second conductivity type is P-type in the aforementioned embodiment, but the disclosure is not limited thereto. A person skilled in the art should understand that the first conductivity type can be P-type and the second conductivity type can be N-type.

Several Examples and Comparative Examples are illustrated in the following to verify the performance of the disclosure.

Example 1

The structure of Example 1 is shown in FIG. 1A, wherein the doping concentration of the N$^+$ substrate is $1\times10^{18}$, the doping concentration of the N$^-$ epitaxial layer is $1.1\times10^{15}$, the doping concentration of the P-type well region is $5\times10^{16}$, the doping concentration of the N$^+$ heavily doped region is $1\times10^{18}$, the doping concentration of the two first doped regions (i.e., the horizontal doped regions) is $4\times10^{16}$, and the doping concentration of the second doped region (i.e., the vertical doped region) is $2\times10^{16}$.

Example 2

The structure of Example 2 is shown in FIG. 1C, wherein the doping concentration of the N$^+$ substrate is $1\times10^{18}$, the doping concentration of the N epitaxial layer is $1.1\times10^{15}$, the doping concentration of the P-type well region is $5\times10^{16}$, the doping concentration of the N$^+$ heavily doped region is $1\times10^{18}$, the doping concentration of the four first doped regions (i.e., the horizontal doped regions) is $4\times10^{16}$, and the doping concentration of the second doped region (i.e., the vertical doped region) is $2\times10^{16}$.

Comparative Example 1

Figure 2A:
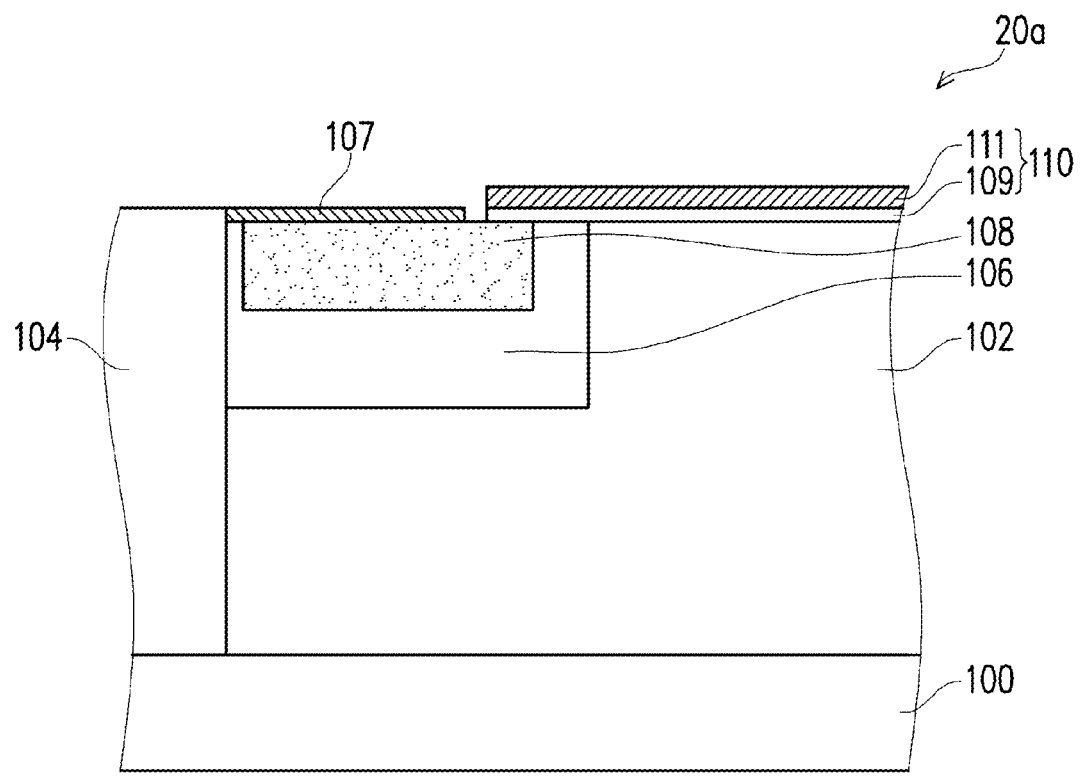
FIG. 2A schematically illustrates a cross sectional view of a conventional MOSFET device.

The structure of the Comparative Example 1 is similar to the structure of the Example 1, except that the structure of the Comparative Example 1 has neither horizontal nor vertical doped regions, as shown in FIG. 2A.

Comparative Example 2

Figure 2B:
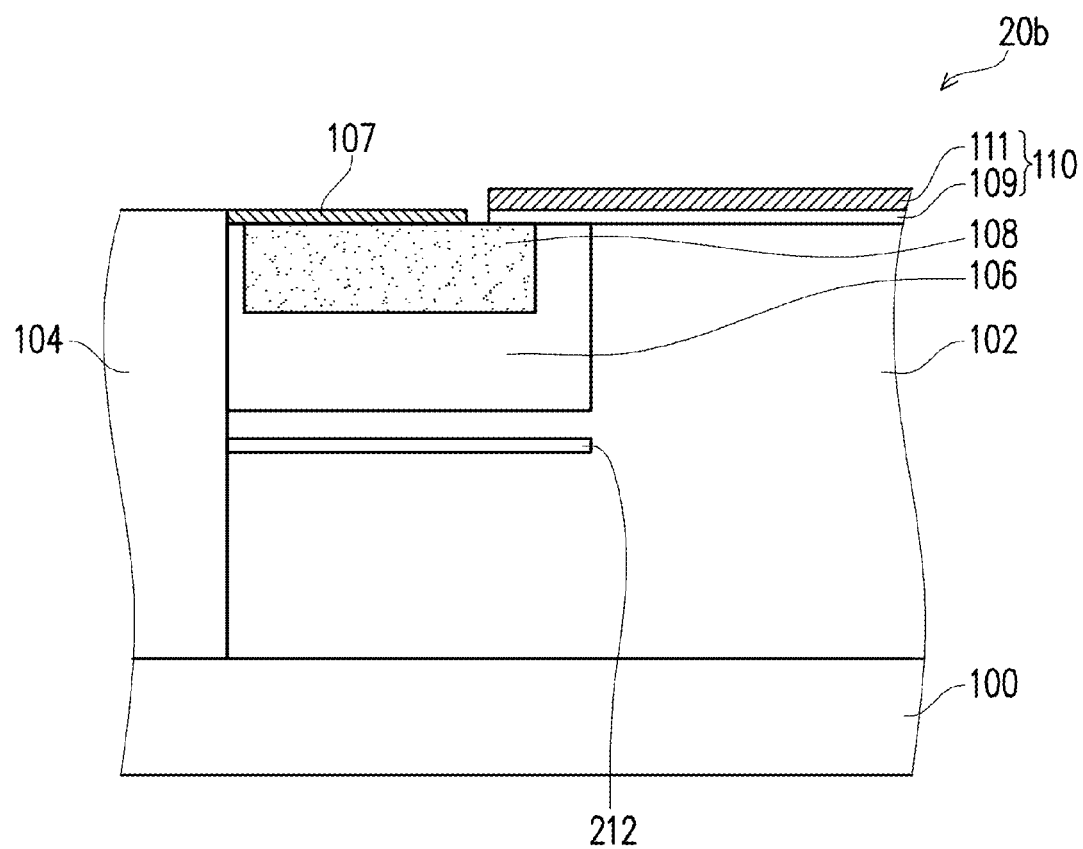
FIG. 2B schematically illustrates a cross sectional view of another conventional MOSFET device.

The structure of the Comparative Example 2 is similar to the structure of the Example 1, except that the structure of the Comparative Example 2 merely has a single layer of horizontal doped regions 212 but no vertical doped region, as shown in FIG. 2B.

Comparative Example 3

Figure 2C:
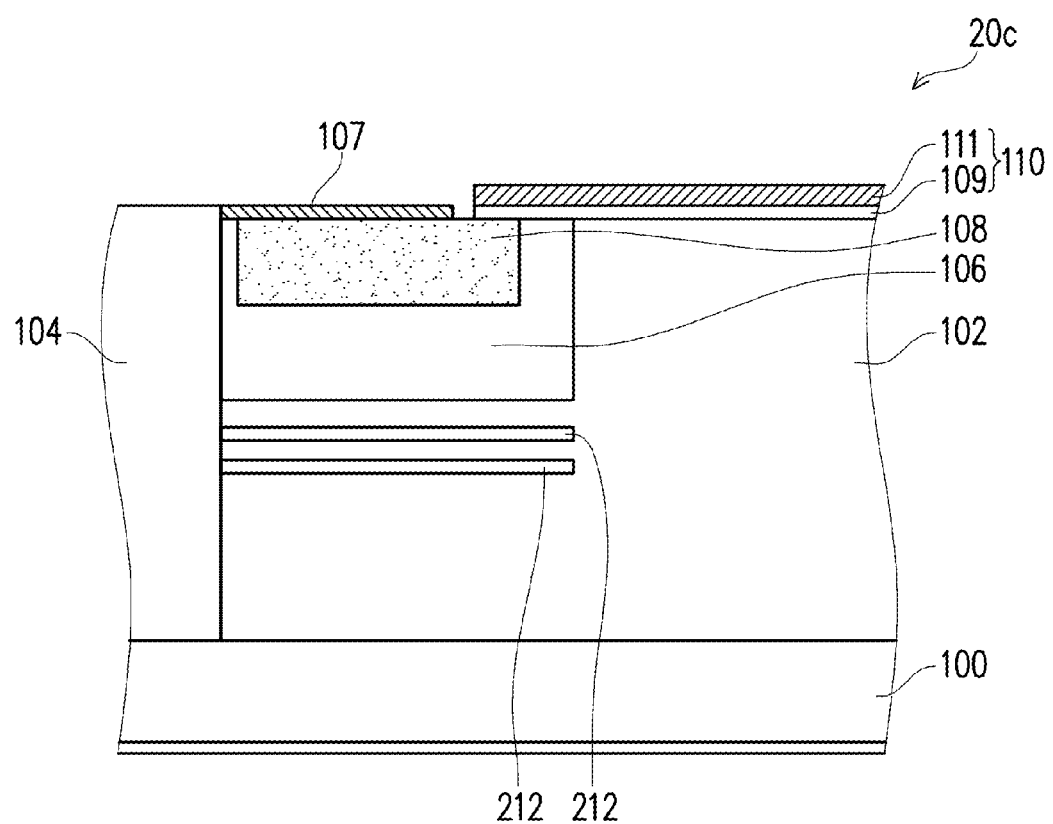
FIG. 2C schematically illustrates a cross sectional view of yet another conventional MOSFET device.

The structure of the Comparative Example 3 is similar to the structure of the Example 2, except that the structure of the Comparative Example 3 has two layers of horizontal doped regions 212 without having any vertical doped region, as shown in FIG. 2C.

Figure 3:
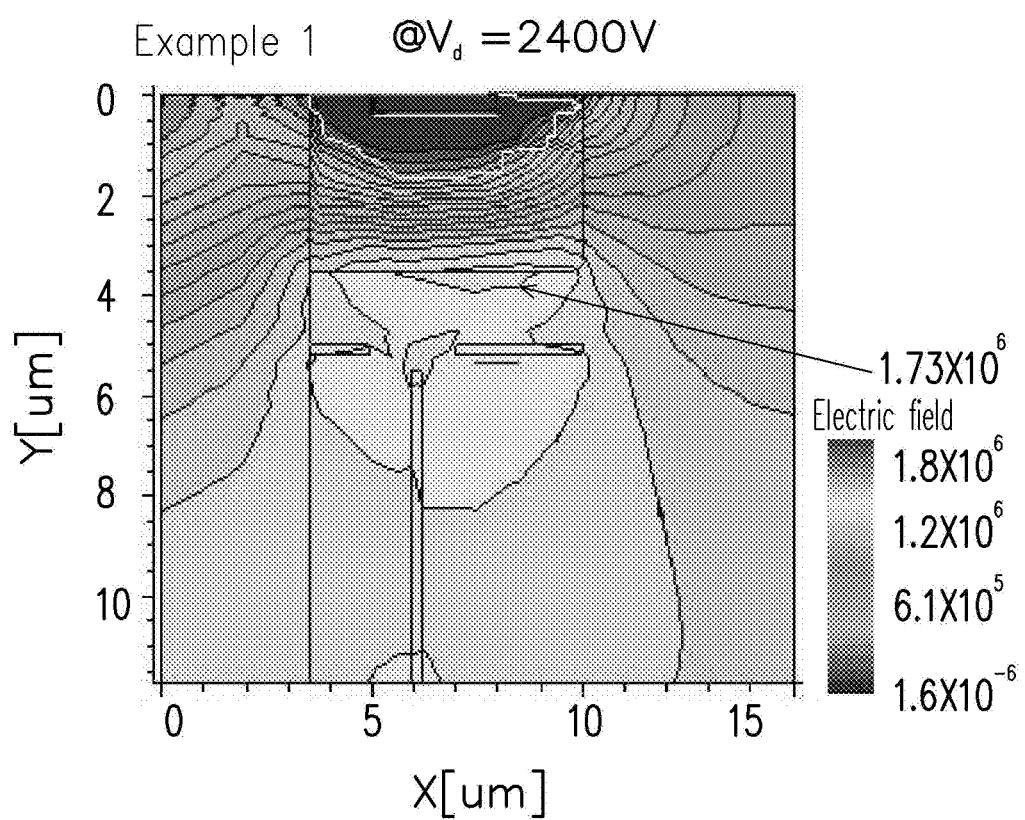
FIG. 3 is an electric-field distribution diagram of the MOSFET device of Example 1.
Figure 4:
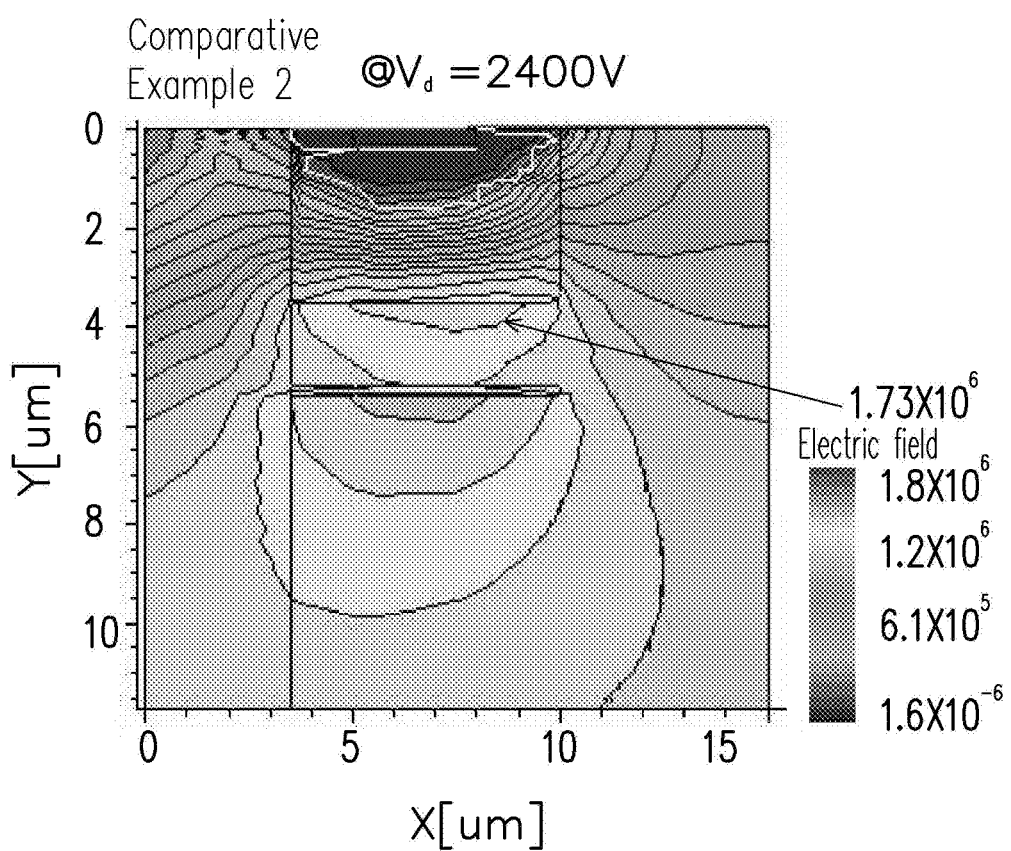
FIG. 4 is an electric-field distribution diagram of the MOSFET device of Comparative Example 2.

FIG. 3 is an electric-field distribution diagram of the MOSFET device of Example 1. FIG. 4 is an electric-field distribution diagram of the MOSFET device of Comparative Example 2. Upon the comparison between FIG. 3 and FIG. 4, the electric field of the P-type well region can be effectively reduced by disposing a vertical doped region between the two horizontal doped regions. More specifically, at same bias voltage (Vd=2400 V), as compared with the MOSFET device 20b without any vertical doped region of Comparative Example 2, the MOSFET device 10a with the vertical doped region of Example 1 can effectively reduce the distribution area for the electric field of $1.73\times10^6$.

Figure 5:
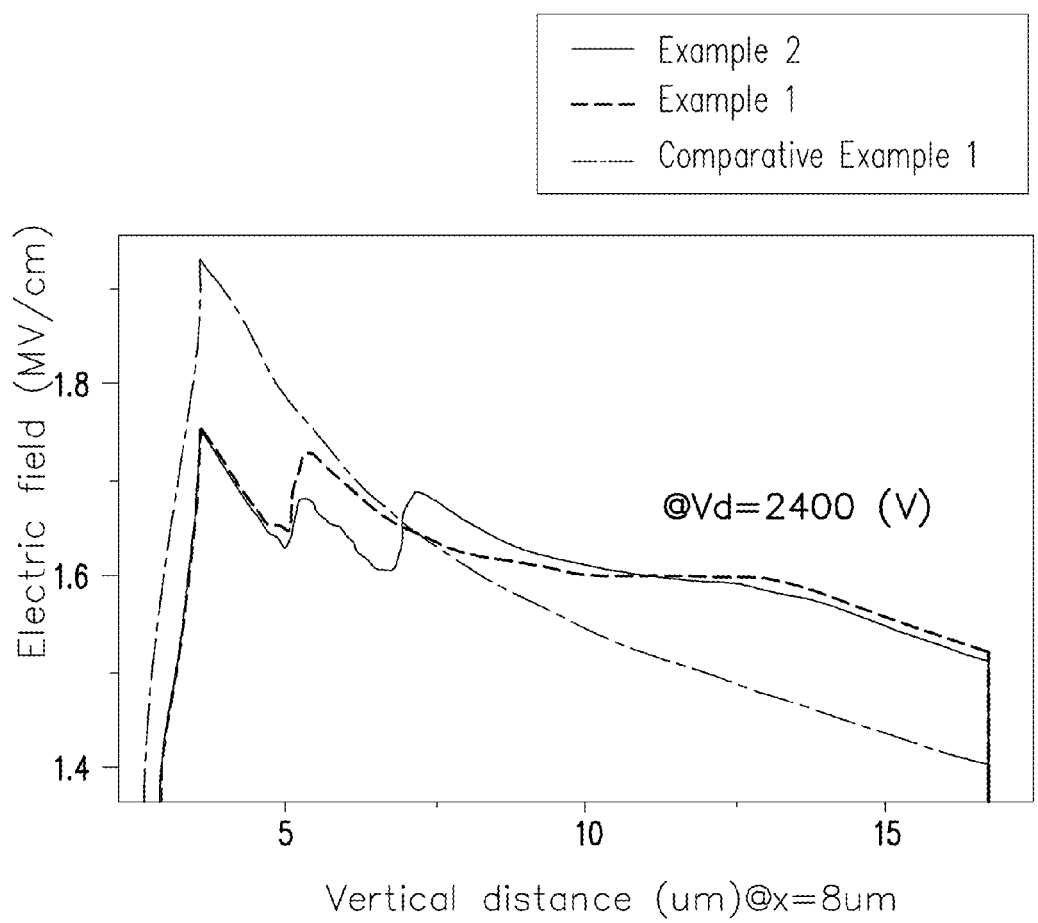
FIG. 5 is a diagram illustrating the relationship between an electric field and a vertical distance of each MOSFET of Examples 1 and 2 and Comparative Example 1.

FIG. 5 is a diagram illustrating the relationship between an electric field and a vertical distance of each MOSFET of Examples 1 and 2 and Comparative Example 1. Referring to FIG. 5, the curve for the MOSFET device 20a of Comparative Example 1 only has a peak due to lack of horizontal and vertical doped regions, where the peak indicates the electric field of the P-type well region. In addition, the curve for the MOSFET device 10a of Example 1 can have two peaks since one vertical doped region and a single layer of horizontal doped regions are disposed, wherein the first peak indicates the electric field of the P-type well region, and the second peak indicates the electric field of the horizontal doped regions. Moreover, the curve for the MOSFET device 10c of Example 2 can have three peaks since one vertical doped region and double layers of horizontal doped regions are disposed, wherein the first peak indicates the electric field of the P-type well region, the second peak indicates the electric field of the upper layer of horizontal doped regions, and the third peak indicates the electric field of the lower layer of horizontal doped regions. As shown in FIG. 5, in terms of the peaks for the P-type well region, the peak of the Comparative Example 1 is greater than the peaks of Example 1 and Example 2. Therefore, the electric field of the P-type well region can be effectively reduced by disposing a vertical doped region between at least two horizontal doped regions in the disclosure. In addition, the peaks for the P-type well region and the upper layer of horizontal doped regions of Example 2 are lower than those of Example 1, indicating that the configuration of Example 2 can further enhance the breakdown voltage.

Figure 6:
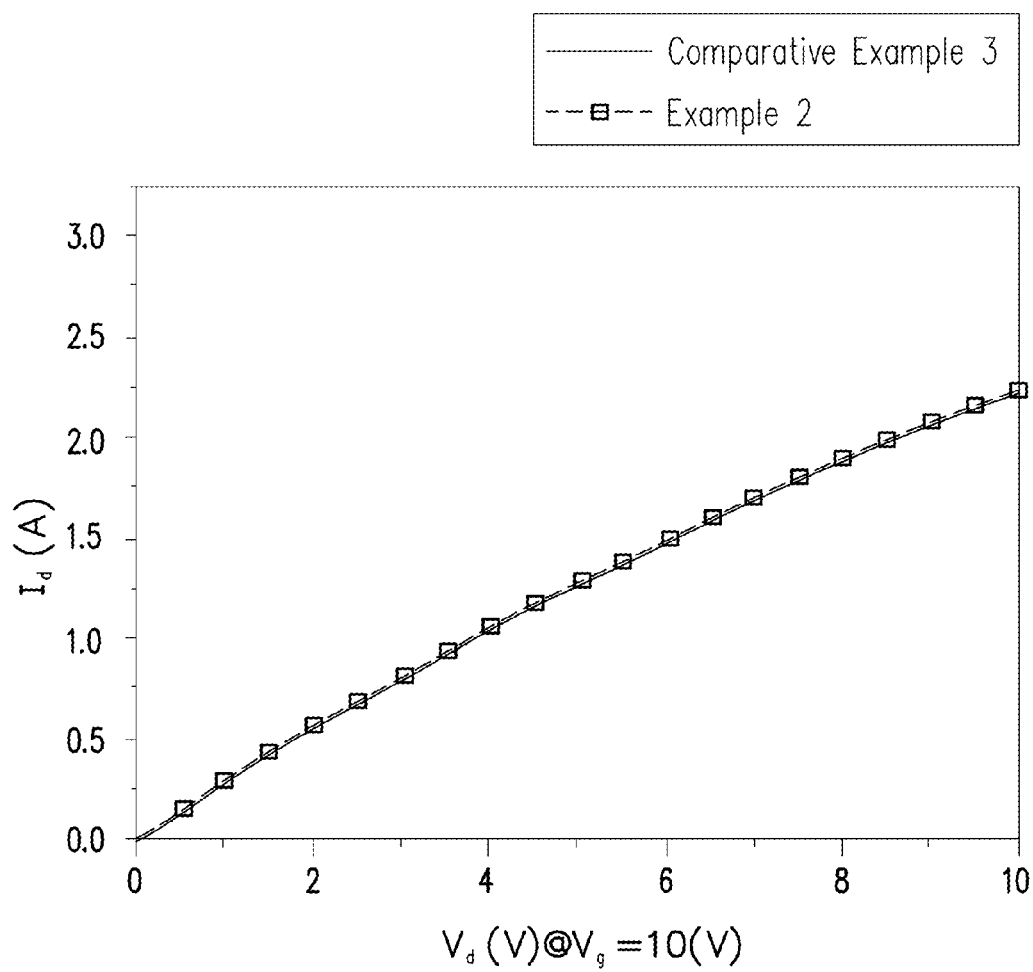
FIG. 6 is a diagram illustrating an I-V curve of each MOSFET of Example 2 and Comparative Example 3, wherein a gate voltage $V_g$ is 10V.

FIG. 6 is a diagram illustrating an I-V curve of each MOSFET of Example 2 and Comparative Example 3, wherein a gate voltage $V_g$ is 10V. The slope of each curve in FIG. 6 represent as an ON-resistance ($R_{on}$). It can be seen that, the curves of Example 2 and Comparative Example 3 almost overlap with each other, indicating that the ON-resistance is not affected by the disposition of the vertical doped region.

Figure 7:
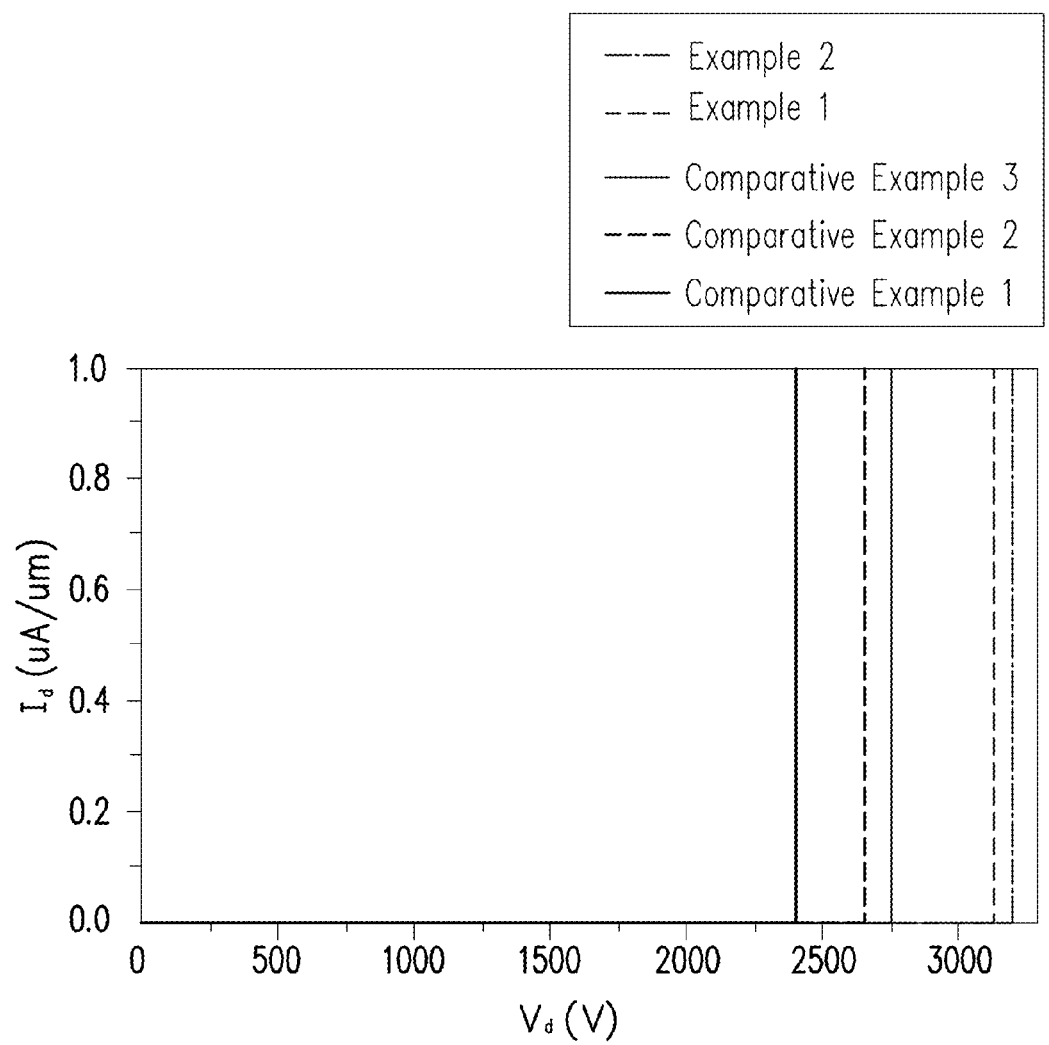
FIG. 7 is a diagram illustrating an I-V curve of each MOSFET of Examples and Comparative Examples, wherein a gate and a drain are grounded.

FIG. 7 is a diagram illustrating an curve of each MOSFET of Examples and Comparative Examples, wherein a gate and a drain are grounded. As shown in FIG. 7, it can be seen that the reverse current is small (namely, almost equals to zero), and the current is then increased rapidly until the breakdown voltage is reached. More specifically, the breakdown voltage of Comparative Example 1 is about 2400 V, the breakdown voltage of Comparative Example 2 is about 2700 V, and the breakdown voltage of Comparative Example 3 is about 2800 V. The breakdown voltage of Example 1 is about 3100 V, and the breakdown voltage of Example 2 is about 3180 V. Accordingly, the disposition of the vertical doped region can effectively enhance the breakdown voltage.

Figure 8:
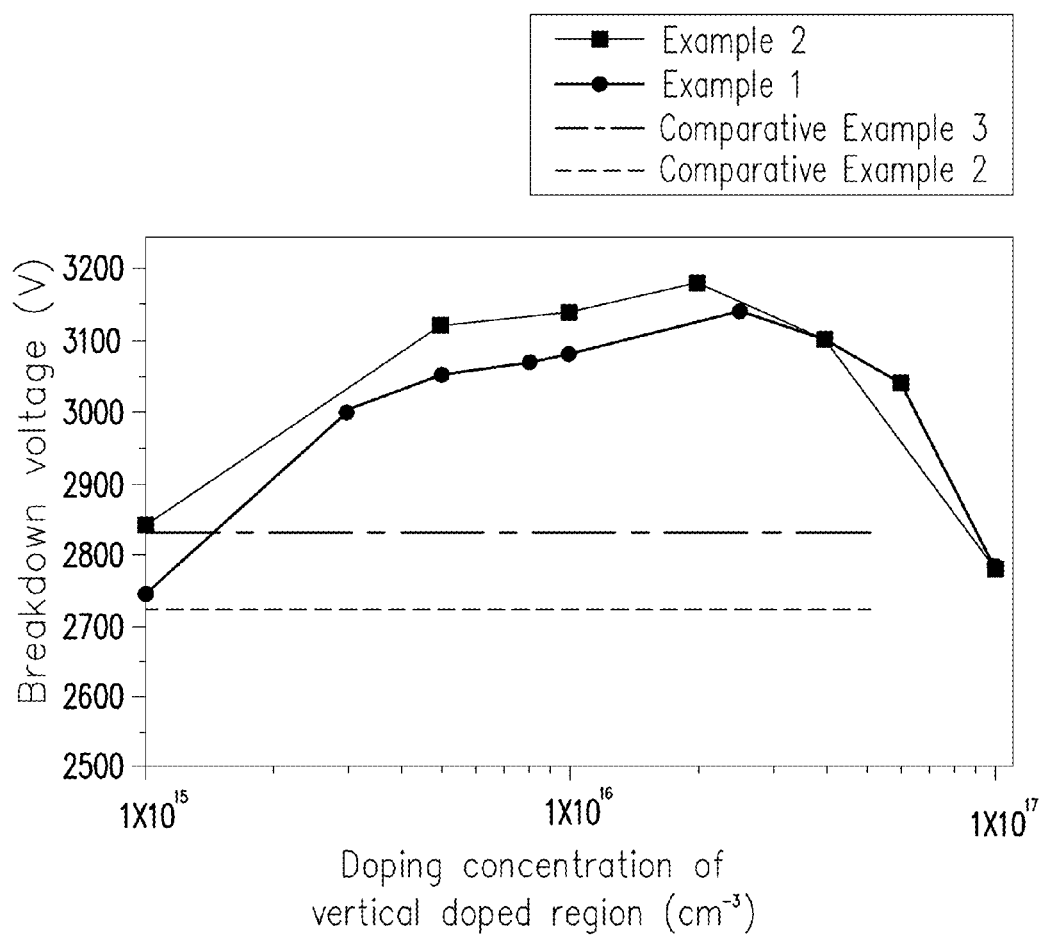
FIG. 8 is a diagram illustrating the relationship between a breakdown voltage and a doping concentration of each vertical doped region of Examples and Comparative Examples.

FIG. 8 is a diagram illustrating the relationship between a breakdown voltage and a doping concentration of each vertical doped region of Examples and Comparative Examples. As shown in FIG. 8, the disposition of the vertical doped region can effectively enhance the breakdown voltage, and the doping concentration of the vertical doped region can affect the breakdown voltage, wherein the breakdown voltage of the device reaches the highest value when the doping concentration of the vertical doped region is about $2\times10^{16}$.

To sum up, in the MOSFET device of the disclosure, at least two P-type horizontal doped regions and at least one P-type vertical doped region located between the P-type horizontal doped regions are disposed in the N-type epitaxial layer below the P-type well region. In this way, by the effect of reduced surface field (RESURF), the electric field between the P-type well region and the N-type epitaxial layer can be reduced and the electric field of the P-type horizontal doped regions can be decreased. In addition, as compared with the conventional MOSFET device, the MOSFET device of the disclosure is capable of effectively increasing the breakdown voltage and improving the performance of the device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A metal oxide semiconductor field effect transistor device, comprising:
    a substrate of a first conductivity type;
    an epitaxial layer of the first conductivity type, disposed on the substrate;
    an insulating trench, disposed in the epitaxial layer;
    a well region of a second conductivity type, disposed in the epitaxial layer at one side of the insulating trench;
    a heavily doped region of the first conductivity type, disposed in the well region;
    a gate structure, disposed on the epitaxial layer and partially overlapping with the heavily doped region;
    at least two first doped regions of the second conductivity type, disposed in the epitaxial layer below the well region; and
    at least one second doped region of the second conductivity type, disposed in the epitaxial layer and located between the first doped regions, wherein the first doped regions and the second doped region are separated from each other, a first long dimension of the first doped regions extend along a first direction and a second long dimension of the second doped region extends along a second direction, and the second direction is different from the first direction, and wherein at least one of the first doped regions contacts the insulating trench while the second doped region does not contact the insulating trench.

2. The metal oxide semiconductor field effect transistor device as claimed in claim 1, wherein the second direction is perpendicular to the first direction.

3. The metal oxide semiconductor field effect transistor device as claimed in claim 1, wherein the first doped regions are horizontal doped regions and the second doped region is a vertical doped region.

4. The metal oxide semiconductor field effect transistor device as claimed in claim 1, wherein a top surface of the second doped region is substantially not higher than a top surface of each first doped region.

5. The metal oxide semiconductor field effect transistor device as claimed in claim 1, wherein a top surface of the second doped region is substantially coplanar with top surfaces of the first doped regions.

6. The metal oxide semiconductor field effect transistor device as claimed in claim 1, wherein the least two first doped regions comprise four first doped regions disposed at two sides of the second doped region.

7. The metal oxide semiconductor field effect transistor device as claimed in claim 6, wherein a top surface of the second doped region is substantially not higher than a highest top surface of the first doped regions.

8. The metal oxide semiconductor field effect transistor device as claimed in claim 6, wherein a top surface of the second doped region is substantially not lower than a lowest bottom surface of the first doped regions.

9. The metal oxide semiconductor field effect transistor device as claimed in claim 1, wherein a bottom surface of the second doped region is located at about 70%-80% of a depth of the epitaxial layer.

10. The metal oxide semiconductor field effect transistor device as claimed in claim 1, wherein a doping concentration of the second doped region is less than a doping concentration of each first doped region.

11. The metal oxide semiconductor field effect transistor device as claimed in claim 1, wherein a doping concentration of the second doped region is greater than a doping concentration of the epitaxial layer.

12. The metal oxide semiconductor field effect transistor device as claimed in claim 1, further comprising a Schottky contact disposed on a surface of the heavily doped region.

13. The metal oxide semiconductor field effect transistor device as claimed in claim 1, wherein the gate structure comprises a gate insulating layer and a gate.

14. The metal oxide semiconductor field effect transistor device as claimed in claim 1, wherein the substrate and the epitaxial layer each comprise silicon or silicon carbide.

15. The metal oxide semiconductor field effect transistor device as claimed in claim 1, wherein the first conductivity type is N-type and the second conductivity type is P-type, or the first conductivity type is P-type and the second conductivity type is N-type.

* * * * *